(12) United States Patent
Lee et al.

(10) Patent No.: US 9,978,625 B2
(45) Date of Patent: May 22, 2018

(54) SEMICONDUCTOR METHOD AND ASSOCIATED APPARATUS

(71) Applicant: TAIWAN SEMICONDUCTOR MANUFACTURING COMPANY LTD., Hsinchu (TW)

(72) Inventors: Yung-Yao Lee, Hsinchu County (TW); Jui-Chun Peng, Hsinchu (TW); Ho-Ping Chen, Hsinchu County (TW); Heng-Hsin Liu, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 17 days.

(21) Appl. No.: 15/170,459

(22) Filed: Jun. 1, 2016

(65) Prior Publication Data

US 2017/0352564 A1 Dec. 7, 2017

(51) Int. Cl.
| | |
|---|---|
| *H01L 21/308* | (2006.01) |
| *H01L 21/68* | (2006.01) |
| *H01L 21/3065* | (2006.01) |
| *G03F 1/42* | (2012.01) |

(52) U.S. Cl.
CPC .............. *H01L 21/682* (2013.01); *G03F 1/42* (2013.01); *H01L 21/308* (2013.01); *H01L 21/3065* (2013.01)

(58) Field of Classification Search
CPC . H01L 21/682; H01L 21/3065; H01L 21/308; G03F 1/42
See application file for complete search history.

(56) References Cited

U.S. PATENT DOCUMENTS 4,952,060 A * 8/1990 Ina .................. G03F 9/7084
356/400

* cited by examiner

*Primary Examiner* — Kyoung Lee
(74) *Attorney, Agent, or Firm* — WPAT, P.C., Intellectual Property Attorneys; Anthony King (57) ABSTRACT

A semiconductor method is disclosed. The semiconductor method is performed upon semiconductor wafers, wherein each of the semiconductor wafers includes a first exposure field and a second exposure field, and each of the first exposure field and the second exposure field includes a first alignment mark and a second alignment mark. The method includes: determining a first alignment pattern for a first wafer by selecting one of the alignment marks of the first exposure field, and selecting one of the alignment marks of the second exposure field; performing the aligning operation upon the first semiconductor wafer by using the first alignment pattern; determining a second alignment pattern for a second wafer by selecting one of the alignment marks of the first exposure field, and selecting one of the alignment marks of the second exposure field, wherein the first alignment pattern is different from the second alignment pattern.

20 Claims, 11 Drawing Sheets

SEMICONDUCTOR METHOD AND ASSOCIATED APPARATUS

BACKGROUND

The semiconductor integrated circuit (IC) industry has experienced rapid growth. Technological advances in IC materials and design have produced generations of ICs where each generation has smaller feature sizes and more complex circuits than those from the previous generation. Conventionally, semiconductor devices are fabricated by patterning a sequence of patterned and un-patterned layers, and the features on successive patterned layers are spatially related to each other. During the fabrication, each patterned layer must be aligned with the previous patterned layers with a degree of precision. Pattern alignment techniques typically provide alignment marks for single-site alignment to achieve overall exposure field alignment. As technology nodes continue to decrease, it has been observed that such alignment techniques provide less than desirable alignment within the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

As technology nodes continue to decrease, it has been observed that the conventional single-site alignment technique provides undesirable line-to-line, width-to-width overlay control across a whole wafer. The problematic overlay control exacerbates when wafer distortion parallels occurs.

Figure 1:
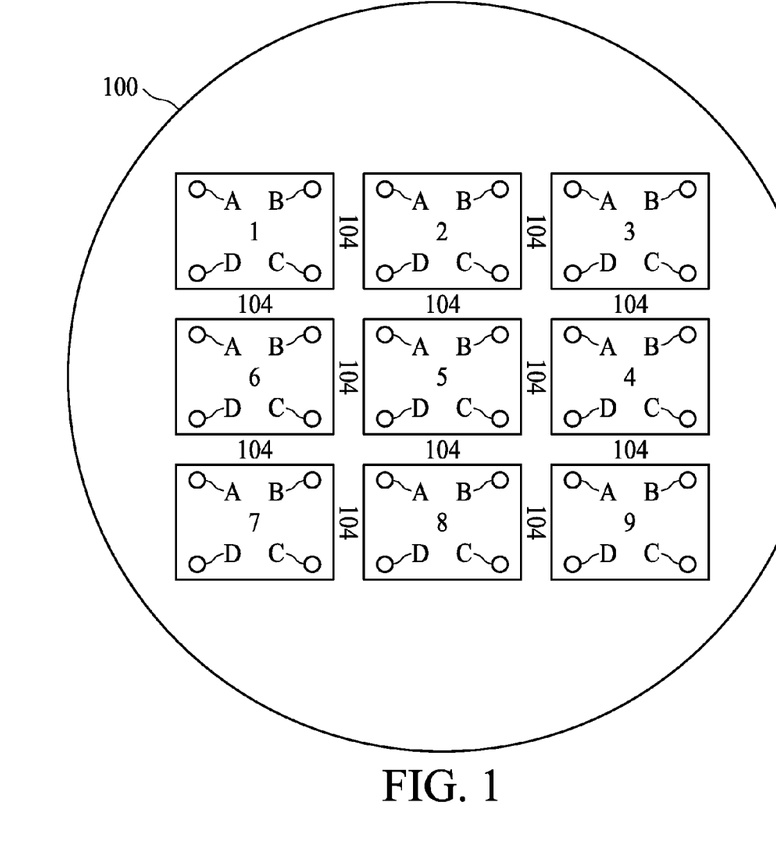
FIG. 1 illustrates a top view of a wafer 100 according to an exemplary embodiment of the present disclosure.

FIG. 1 illustrates a wafer 100. The wafer 100 includes a substrate (e.g., a semiconductor substrate), a mask (photomask or reticle, collectively referred to as mask), or any base material on which processing is conducted to produce layers of material, pattern features, and/or integrated circuits. For example, the wafer 100 includes an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In some examples, the silicon substrate may include a multilayer compound semiconductor structure. Alternatively, the wafer 100 may include a non-semiconductor material, such as a glass substrate for thin-film-transistor liquid crystal display (TFT-LCD) devices, or fused quartz or calcium fluoride for a photomask (mask).

The wafer 100 is subjected to one or more deposition, patterning, and/or etching process to form a plurality of patterned and un-patterned layers thereon. For example, the wafer 100 is subjected to a lithography process to form one or more features on the wafer. In the present embodiment, the wafer 100 is subjected to a lithography process to form an integrated circuit device thereon. The terms lithography, immersion lithography, photolithography, and optical lithography may be used interchangeably. The lithography process projects an image of an integrated circuit device onto an exposure field of the wafer 100. Or, put another way, the lithography process transfers a pattern (i.e., image of an integrated circuit device) from a mask (also referred to as a photomask or reticle) onto the wafer. The process can involve projecting the image multiple times on the wafer, each projection patterning an exposure field of the wafer. As illustrated in FIG. 1, the wafer 100 is divided into one or more exposure fields. In particular, the wafer is divided into exposure fields 1, 2, 3, 4, 5, 6, 7, 8, and 9. An exposure field includes an area of a substrate covered (e.g., exposed) by a single exposure process. So, when the wafer 100 is subjected to a lithography process, a single exposure process may be used to transfer a pattern to each exposure field (i.e., 1, 2 . . . 9), for example, in a sequence according to the numerical order, to form integrated circuits within each exposure field. The exposure fields 1-9 are separated or defined by scribe lines (or lanes) 104. In the present embodiment, the scribe lines 104 are configured between each exposure field to identify a perimeter of each exposure field. When each exposure field is exposed, one or more dies (chips) are patterned within the field.

One or more dies (chips) of the wafer 100 are patterned within each exposure field, and thus, multiple dies can be patterned within a single exposure field. For example, an exposure field may pattern an 1×1 chip array; an 1×2 or 2×1 chip array; a 2×2 chip array; a 3×2 or 2×3 chip array; a 3×3 chip array; a 2×4 or 4×2 chip array; or other suitable chip arrays. Where multiple exposure fields are delineated on the wafer 100, as in FIG. 1, the pattern is formed in each field. For example, if an exposure filed patterns a 2×2 chip array, each exposure field (i.e., exposure fields 1, 2, . . . and 9) will include four patterned chips. Similarly to delineation of the exposure fields, scribe line regions separate (or define) adjacent dies. The scribe line regions/scribe lines are dice/cut therethrough in a later fabrication process to provide individual dies, which may then be packaged and sold as individual integrated circuit chips. The scribe line regions are cut in such a way that the semiconductor devices in each die are not damaged.

As noted above, lithography processes form features on the wafer. In the present example, integrated circuit devices are formed on the wafer 100 to form a plurality of dies. The lithography process patterns a sequence of patterned and un-patterned layers, and the features on successive patterned layers are spatially related to each another. During fabrication, each patterned layer must be aligned with the previous patterned layers with a degree of precision. Thus, a key part of successful lithography relies on pattern recognition. Pattern recognition utilizes pattern alignment techniques. A lower (previous) patterned layer will include an overlay target, and a second pattern on an upper (next) patterned layer can then be aligned.

Generally, pattern alignment techniques form alignment (or registration) marks in the exposure field. More particularly, four alignment marks A, B, C and D may also be formed in the scribe lines 104 surrounding each exposure field. The four alignment marks A, B, C and D may locate around four corners of each exposure field. It is noted that other arrangement of the alignment marks A, B, C and D are also contemplated. For example, in some embodiments, there may be less or more than 4 alignment marks formed around four edges or center of each exposure field. In some embodiments, alignment marks may be formed in the scribe lines 104. The alignment marks A, B, C and D may be designed to include shapes other than circles/dots, including triangles, rectangles, quadrilaterals, T-shapes, L-shapes, pluses, crosses, octagons, other suitable shapes, and/or combinations.

The four alignment marks A, B, C and D may utilize a box-in-box ("BIB") pattern recognition technique for aligning successive patterned layers. For instance, a box-in-box pattern recognition technique may utilize an outer box, i.e. an overlay target, and an inner box. The BIB pattern recognition technique aligns the inner box with the overlay target. For the sake of example, the outer box can be formed in a lower (previous) patterned layer and the inner box will be formed in an upper (next) patterned layer. There may be one or more layers between the two. The outer box has a first range of dimensions, and the inner box has a second range of dimensions. For example, a width of the outer box may be in the range of between about 10 µm and about 40 µm, while a width of the inner box may be between about 5 µm and about 30 µm. As a result, a distance d between the inner and outer boxes may be between about 5 µm and about 20 µm. It is noted that other sizes of the inner and outer boxes are also contemplated. It is understood that the pattern recognition may utilize other overlay target designs, such as frame-in-frame, segmented-frame, advanced imaging metrology (AIM), and short vernier (SVNR).

Generally, when operated, the four alignment marks A, B, C and D in each exposure field are not all used for wafer alignment each time in order to save process time in a scanner. In the present disclosure, a novel mechanism is proposed, wherein one of the alignment marks A, B, C and D is selected to be used for wafer alignment in each exposure field according to predetermined alignment patterns. For example, there are four different alignment patterns in total. The four different alignment patterns may be distributed to all wafers desired to be aligned in a predetermined order. In some embodiments, a first wafer of the wafers may be arranged to use the first pattern of alignment marks; a second wafer of the wafers may be arranged to use the second pattern of alignment marks; a third wafer of the wafers may be arranged to use the third pattern of alignment marks; a fourth wafer of the wafers may be arranged to use the fourth pattern of alignment marks; the fifth wafer of the wafers may be arranged to use the first pattern of alignment marks; and so on until all the wafers are assigned to one of the four patterns.

In some embodiment, the wafers may include several wafer lots, and a first wafer lot of the wafers may be arranged to use the first pattern of alignment marks; a second wafer lot of the wafers may be arranged to use the second pattern of alignment marks; a third wafer lot of the wafers may be arranged to use the third pattern of alignment marks; a fourth wafer lot of the wafers may be arranged to use the fourth pattern of alignment marks; a fifth wafer lot of the wafers may be arranged to use the first pattern of alignment marks; and so on until all the wafer lots are assigned to one of the four patterns.

Figure 2A:
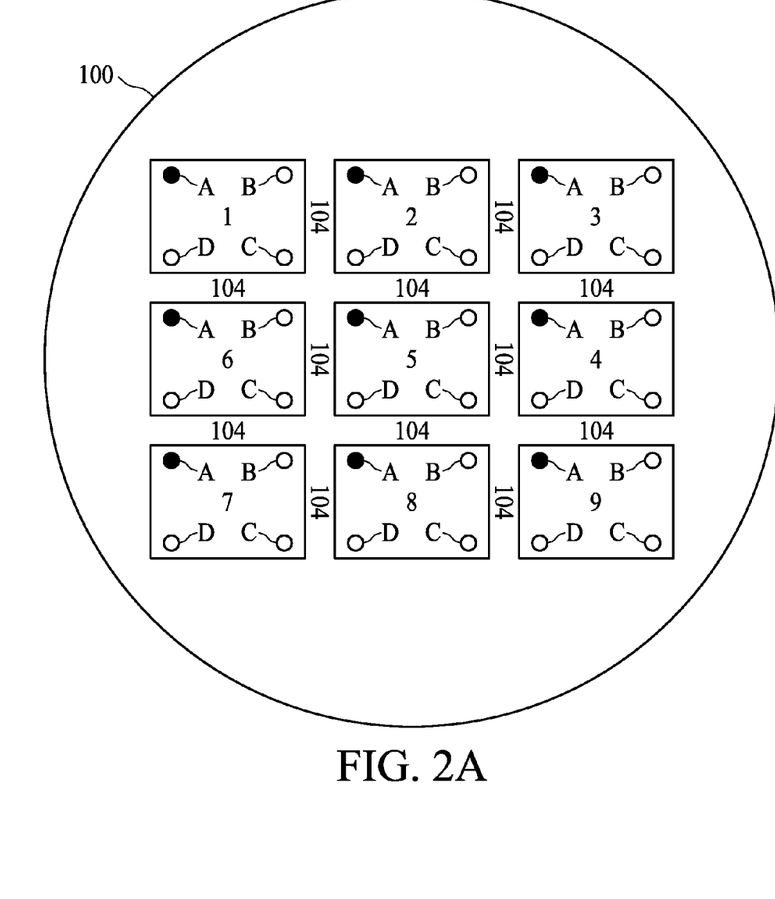
FIG. 2A illustrates a first pattern of alignment marks employed for alignment according to a first embodiment of the present disclosure.
Figure 2B:
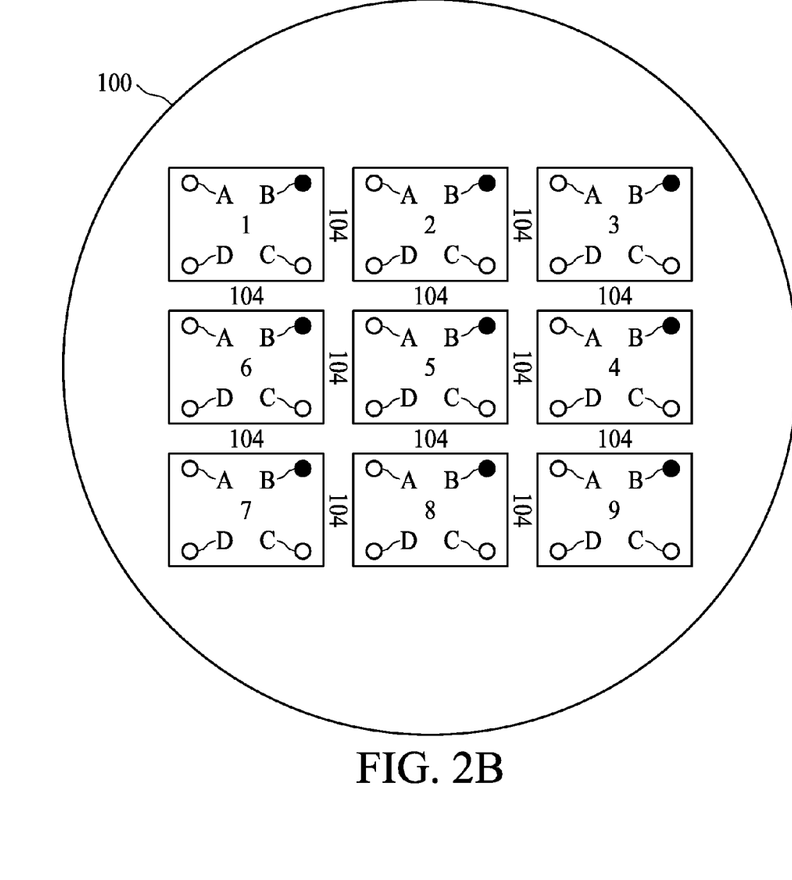
FIG. 2B illustrates a second pattern of alignment marks employed for alignment according to the first embodiment of the present disclosure.
Figure 2C:
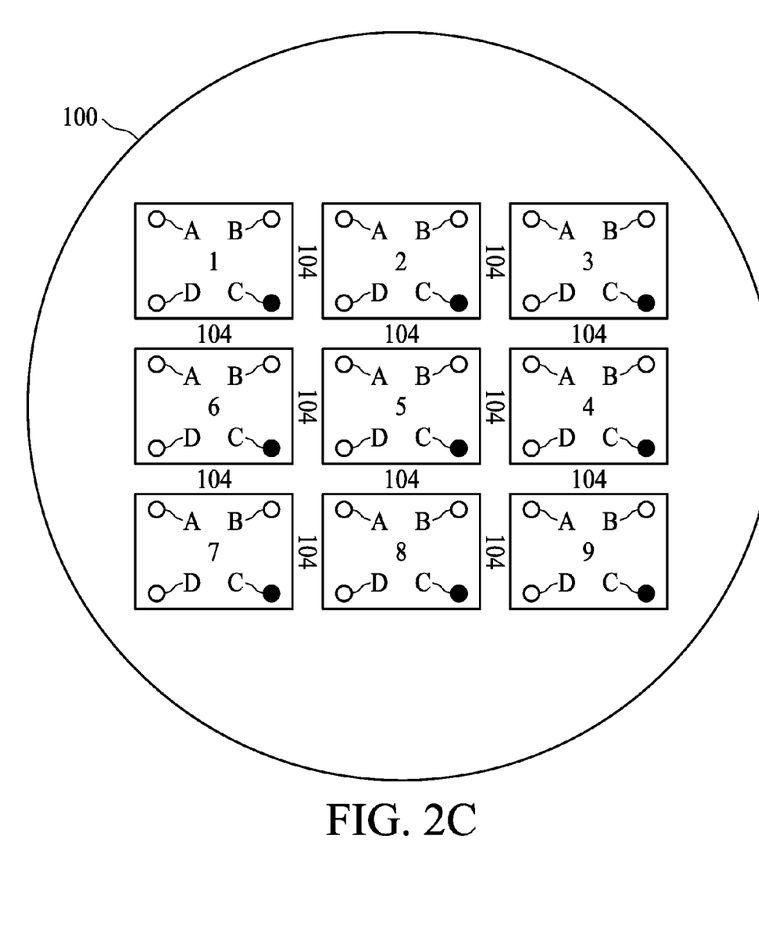
FIG. 2C illustrates a third pattern of alignment marks employed for alignment according to the first embodiment of the present disclosure.
Figure 2D:
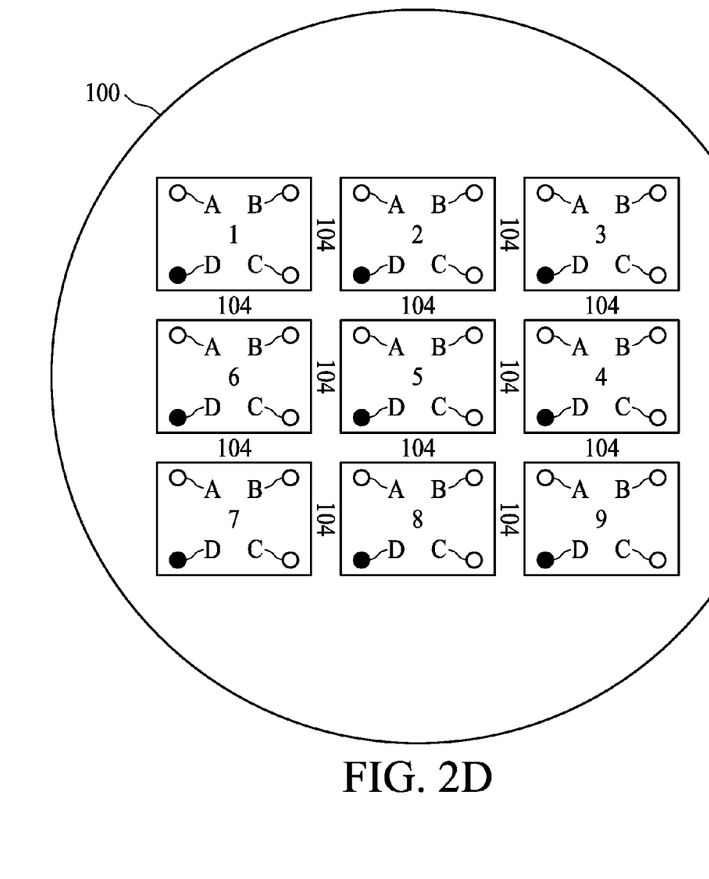
FIG. 2D illustrates a fourth pattern of alignment marks employed for alignment according to the first embodiment of the present disclosure.

FIG. 2A illustrates a first pattern of alignment marks employed for wafer alignment according to a first embodiment of the present disclosure. When performing an aligning operation in a scanner upon a wafer, only the alignment marks denoted as solid dots, i.e. the alignment marks A, are taken into consideration. FIG. 2B illustrates a second pattern of alignment marks employed for wafer alignment according to the first embodiment of the present disclosure. When performing an aligning operation in a scanner upon a wafer, only the alignment marks denoted as solid dots, i.e. the alignment marks B, are taken into consideration. FIG. 2C illustrates a third pattern of alignment marks employed for wafer alignment according to the first embodiment of the present disclosure. When performing an aligning operation in a scanner upon a wafer, only the alignment marks denoted as solid dots, i.e. the alignment marks C, are taken into consideration. FIG. 2D illustrates a fourth pattern of alignment marks employed for wafer alignment according to the first embodiment of the present disclosure. When performing an aligning operation in a scanner upon a wafer, only the alignment marks denoted as solid dots, i.e. the alignment marks D, are taken into consideration.

Figure 3:
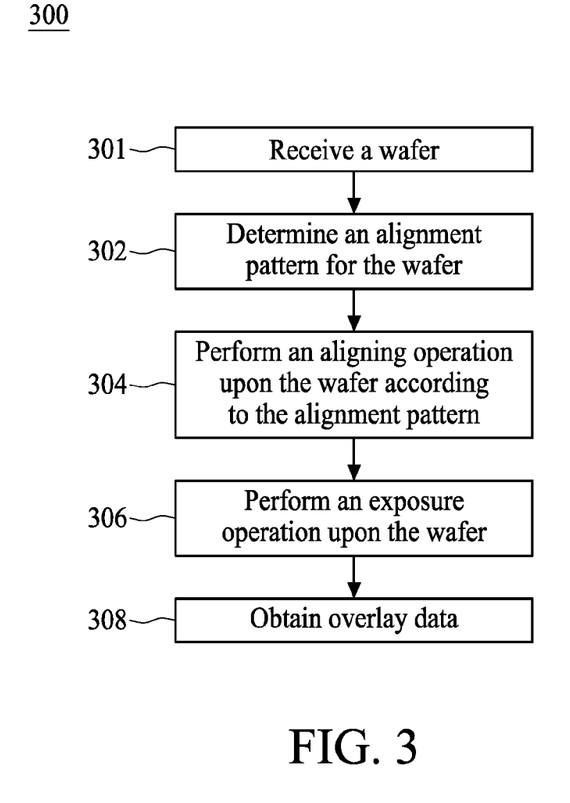
FIG. 3 is a flowchart illustrating an exposure method according to an embodiment of the present disclosure.
Figure 4:
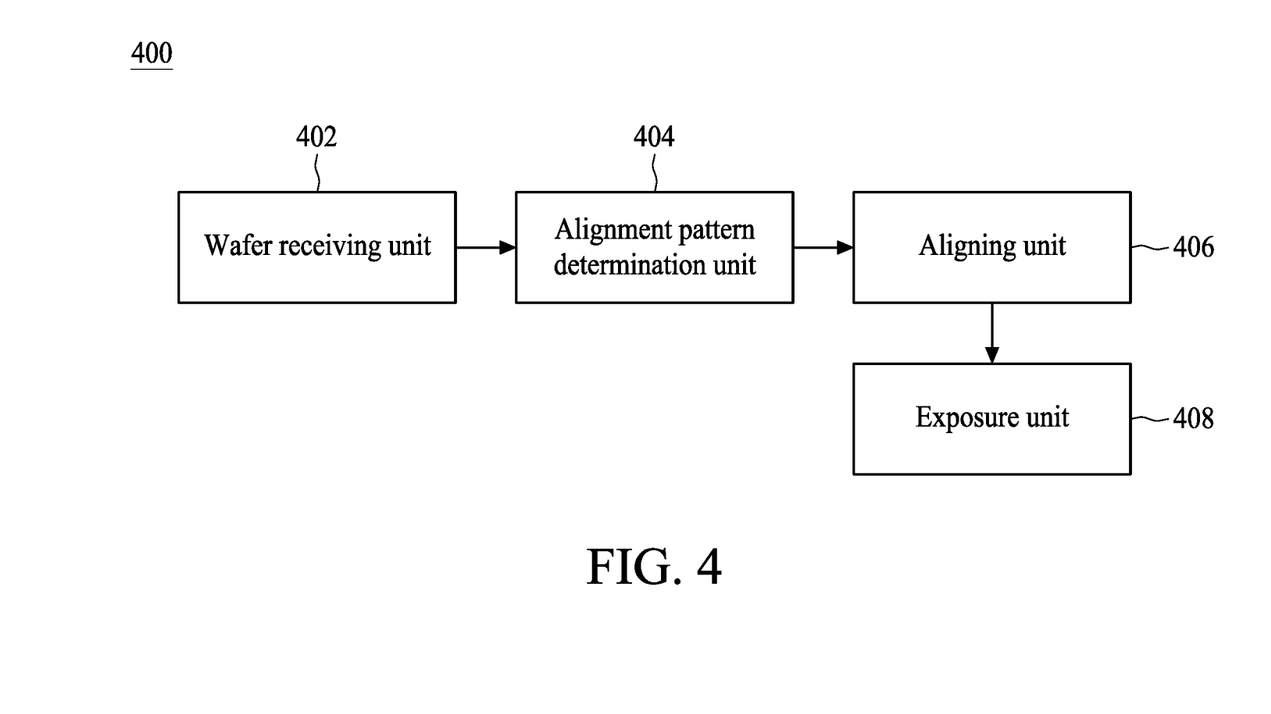
FIG. 4 is a diagram illustrating a semiconductor apparatus according to an embodiment of the present disclosure.

FIG. 3 is a flowchart illustrating an exposure method 300 according to an embodiment of the present disclosure. In some embodiments, operations 301, 302, 304 and 306 may be performed by a semiconductor apparatus 400 shown in FIG. 4, such as a scanner, and an operation 308 may be performed by another semiconductor apparatus, such as an overlay tool. In the operation 301 of the exposure method 300, a wafer is provided to a wafer receiving unit 402 of the semiconductor apparatus 400. In the operation 302, an alignment pattern determination unit determines an alignment pattern that will be used to perform an aligning operation. For example, one of the four alignment patterns shown in FIGS. 2A-2D are selected based on the sequence of wafers provided to the scanner as mentioned above. In the operation 304, when the alignment pattern is determined, an aligning unit 406 performs an aligning operation by using the alignment marks indicated by the solid dots of the determined alignment patterns. In the operation 306, an exposure operation is performed by an exposure unit 408 upon the wafer after the aligning operation, and then the wafer will be moved into an overlay tool from the semiconductor apparatus 400. As indicated in the operation 308, an overlay data will be obtained by the overlay tool, and the overlay data may be incorporated into the overlay data previously obtained and stored in the overlay tool. In the embodiment, overlay tool feeds back the real-time and updated overlay data to the exposure tool for correction of the overlay; that is, how closely two layers are aligned. However, in some embodiments, the overlay correction process may be not a real-time process.

Compared to the existing operations, the proposed method 300 can determine an alignment pattern for a wafer. That is to say, the alignment pattern for each wafer or wafer lot can be different. For example, when all of the four alignment patterns indicated in FIGS. 2A-2D are used at the operation 304 for different wafers or wafer lots sequentially, a more representative overlay data will be obtained since all of the alignment marks A-D of all the exposure fields have been used and taken into consideration for generating the overlay data. The more representative overlay data may be used for real-time calibration of the wafer aligning operation, thus enhancing the overall electrical properties of dies on the wafers.

Figure 5A:
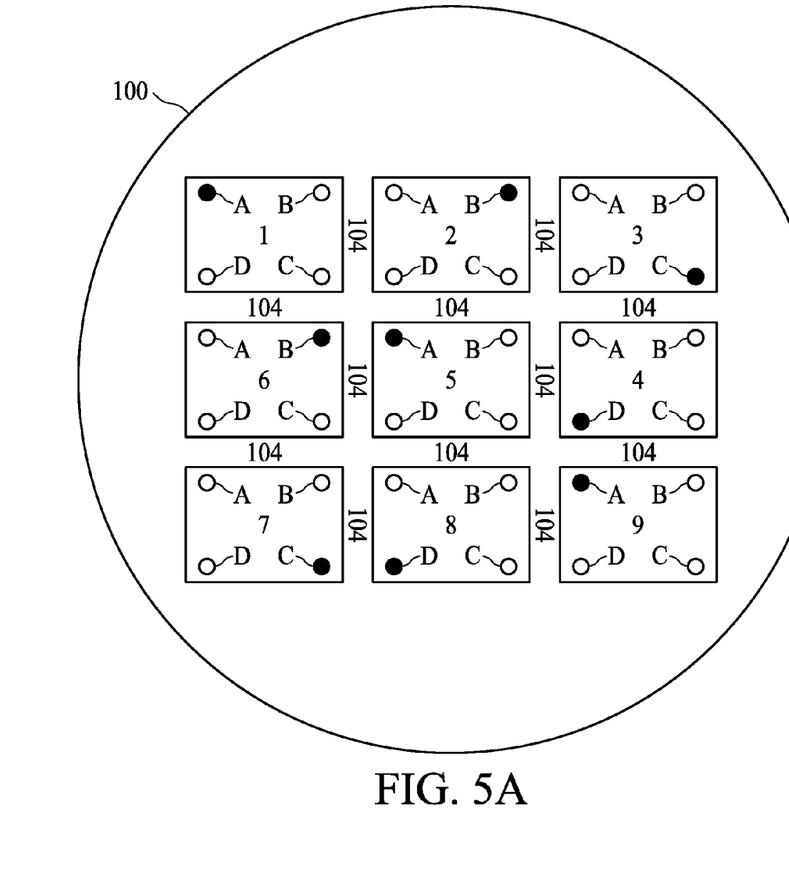
FIG. 5A illustrates a first pattern of alignment marks employed for alignment according to a second embodiment of the present disclosure.

FIG. 5A illustrates a first pattern of alignment marks employed for wafer alignment according to a second embodiment of the present disclosure. The first pattern of alignment marks shown in FIG. 5A is more complex compared to the pattern shown in FIG. 2A. In particular, the alignment marks A, B, C, D, A, B, C, D and A are sequentially employed in the exposure fields 1, 2, 3, 4, 5, 6, 7, 8, and 9. In this way, each exposure fields 1, 2, 3, 4, 5, 6, 7, 8, and 9 may have different alignment marks A, B, C and D being employed in a single wafer. The first pattern of FIG. 5A selects the alignment marks in a more random way. As such, when considering overlay data calculated by using a single wafer, the first pattern of FIG. 5A can further elevate representatives of the overlay data compared to the first pattern of FIG. 2A. The result of the overlay feed back correction thus can converge more quickly and the overall performance of the exposure can be improved.

Figure 5B:
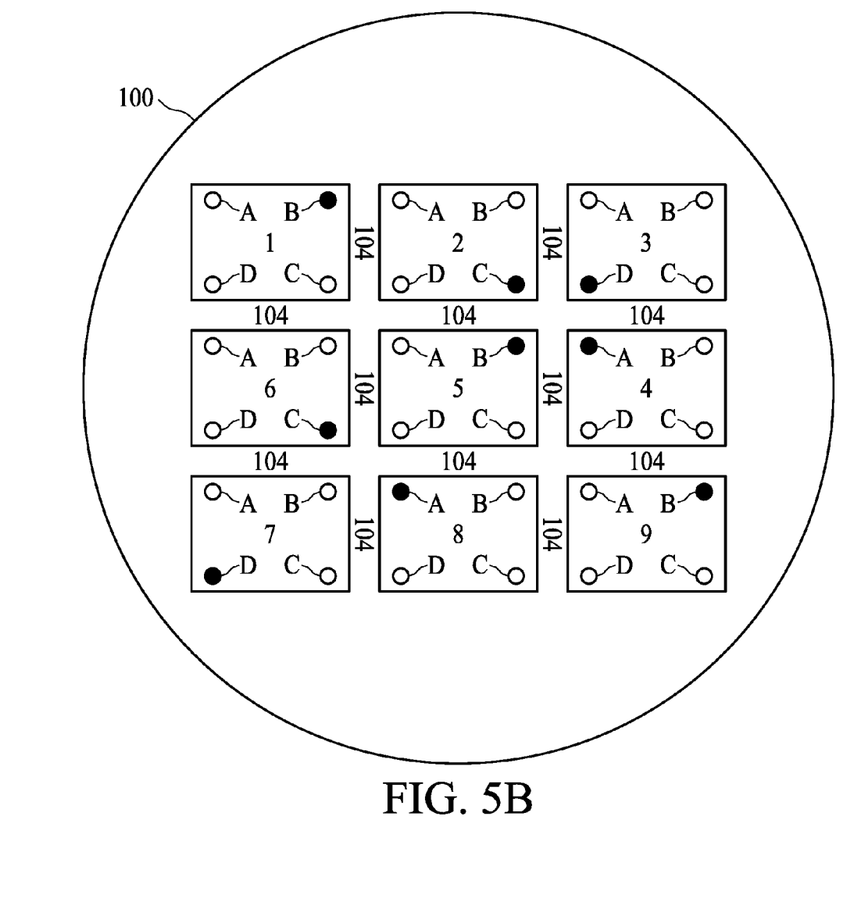
FIG. 5B illustrates a second pattern of alignment marks employed for alignment according to the second embodiment of the present disclosure.
Figure 5C:
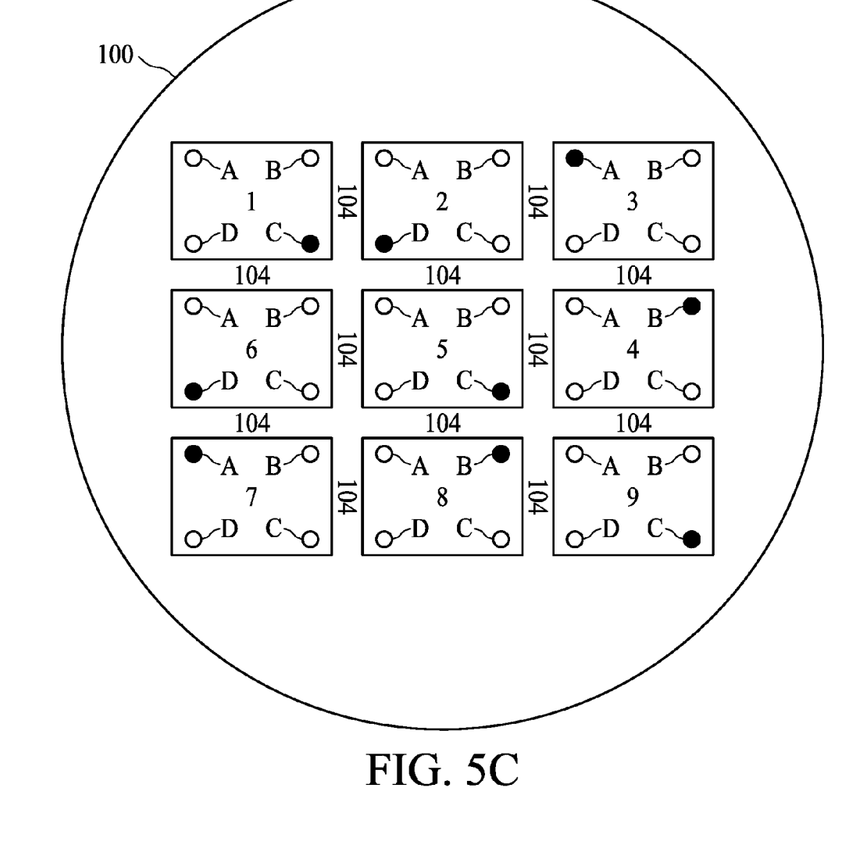
FIG. 5C illustrates a third pattern of alignment marks employed for alignment according to the second embodiment of the present disclosure.
Figure 5D:
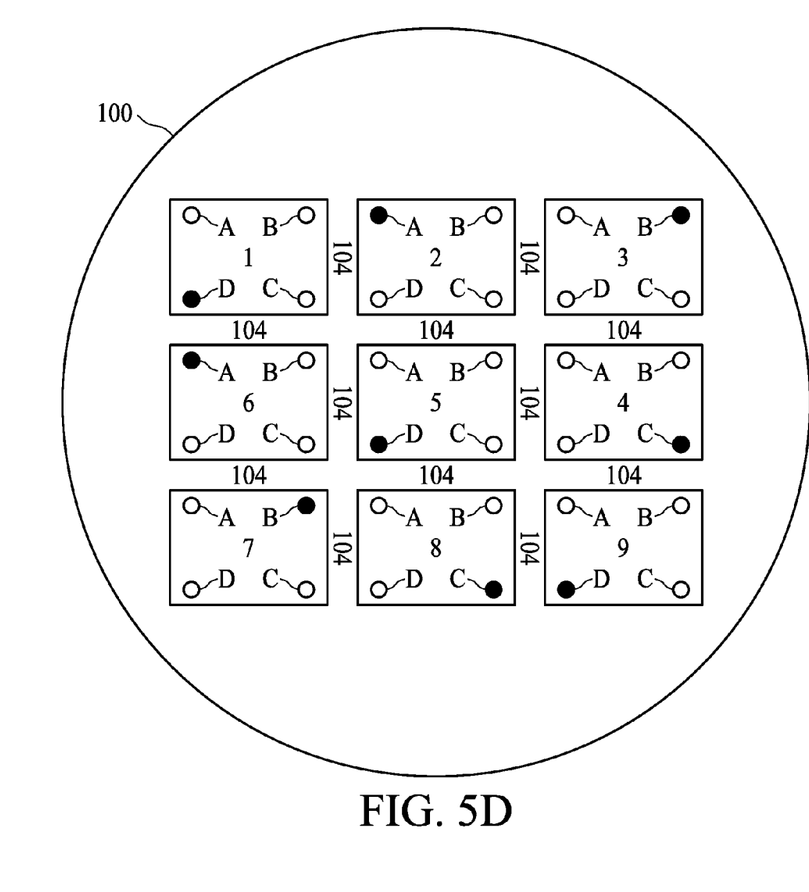
FIG. 5D illustrates a fourth pattern of alignment marks employed for alignment according to the second embodiment of the present disclosure.

FIGS. 5B-5D illustrates a second pattern, a third pattern and a fourth pattern of alignment marks employed for wafer alignment according to the second embodiment of the present disclosure. In FIG. 5B, the alignment marks B, C, D, A, B, C, D, A and B are sequentially employed in the exposure fields 1, 2, 3, 4, 5, 6, 7, 8, and 9. In FIG. 5C, the alignment marks C, D, A, B, C, D, A, B and C are sequentially employed in the exposure fields 1, 2, 3, 4, 5, 6, 7, 8, and 9. In FIG. 5D, the alignment marks D, A, B, C, D, A, B, C and D are sequentially employed in the exposure fields 1, 2, 3, 4, 5, 6, 7, 8, and 9. In some embodiments, the sequential order of the alignment marks may be alternatively changed.

Some embodiments of the present disclosure provide a semiconductor method performed upon semiconductor wafers, wherein each of the semiconductor wafers includes a first exposure field and a second exposure field, and each of the first exposure field and the second exposure field includes a first alignment mark and a second alignment mark. The method includes: determining a first alignment pattern by selecting one of the first alignment mark and the second alignment mark designated to the first exposure field of a first wafer, and selecting one of the first alignment mark and the second alignment mark designated to the second exposure field of the first wafer; performing the aligning operation upon the first semiconductor wafer by using the first alignment pattern; determining a second alignment pattern by selecting one of the first alignment mark and the second alignment mark designated to the first exposure field of a second wafer, and selecting one of the first alignment mark and the second alignment mark designated to the second exposure field of the second wafer, wherein the first alignment pattern is different from the second alignment pattern; and performing the aligning operation upon the second semiconductor wafer by using the second alignment pattern.

Some embodiments of the present disclosure provide a semiconductor method performed upon semiconductor wafers, wherein each of the semiconductor wafers includes at least two exposure fields, and each of the exposure fields includes at least two alignment marks. The method includes: determining at least two alignment patterns, wherein each of the alignment patterns indicates whether each of the alignment marks of each of the exposure fields is selected for an aligning operation, only a portion of the alignment marks are selected in each of the exposure fields of one of the at least two alignment patterns, and each of the alignment marks of each of the exposure fields is selected by at least one of the at least two alignment patterns; receiving a semiconductor wafer of the semiconductor wafers; selecting one of the at least two alignment patterns according to a predetermined order; and performing the aligning operation upon the received semiconductor wafer by using the selected alignment pattern.

Some embodiments of the present disclosure provide a semiconductor apparatus, for performing operations upon semiconductor wafers, wherein each of the semiconductor wafers includes at least two exposure fields, and each of the at least two exposure fields includes at least two alignment marks. The semiconductor apparatus includes: a wafer receiving unit, arranged for receiving a semiconductor wafer of the semiconductor wafers; an alignment pattern determination unit, coupled to the wafer receiving unit and arranged for selecting one of at least two alignment patterns; and aligning unit, coupled to the alignment pattern determination unit and arranged for performing an aligning operation upon the semiconductor wafer by using the one of the at least two alignment pattern being selected.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor method performed upon semiconductor wafers, wherein each of the semiconductor wafers includes a first exposure field and a second exposure field, and each of the first exposure field and the second exposure field includes a first alignment mark and a second alignment mark, the method comprising:
   determining a first alignment pattern by selecting one of the first alignment mark and the second alignment mark designated to the first exposure field of a first semiconductor wafer, and selecting one of the first alignment mark and the second alignment mark designated to the second exposure field of the first semiconductor wafer;
   performing the aligning operation upon the first semiconductor wafer by using the first alignment pattern;
   determining a second alignment pattern by selecting one of the first alignment mark and the second alignment mark designated to the first exposure field of a second semiconductor wafer, and selecting one of the first alignment mark and the second alignment mark designated to the second exposure field of the second semiconductor wafer, wherein the first alignment pattern is different from the second alignment pattern; and
   performing the aligning operation upon the second semiconductor wafer by using the second alignment pattern.

2. The semiconductor method of claim 1, wherein the first alignment mark and the second alignment mark of each of the first exposure field and the second exposure field locate at different locations of each of the first exposure field and the second exposure field.

3. The semiconductor method of claim 2, wherein the first exposure field and the second exposure field substantially have a same integrated circuit pattern.

4. The semiconductor method of claim 1, wherein each of the first exposure field and the second exposure field includes at least one die.

5. The semiconductor method of claim 3, further comprising:
   performing an exposure operation upon the first semiconductor wafer.

6. The semiconductor method of claim 3, further comprising:
   performing an exposure operation upon the second semiconductor wafer.

7. The semiconductor method of claim 3, wherein determining the first alignment pattern further comprises:
   selecting the first alignment mark from the first exposure field of the first semiconductor wafer, and selecting the second alignment mark from the second exposure field of the first semiconductor wafer.

8. The semiconductor method of claim 7, wherein determining the second alignment pattern further comprises:
   selecting the first alignment mark from the first exposure field of the second semiconductor wafer, and selecting the second alignment mark from the second exposure field of the second semiconductor wafer.

9. A semiconductor method performed upon semiconductor wafers, wherein each of the semiconductor wafers includes at least two exposure fields, and each of the exposure fields includes at least two alignment marks, the method comprising:
   determining at least two alignment patterns, wherein each of the alignment patterns indicates whether each of the alignment marks of each of the exposure fields is selected for an aligning operation, only a portion of the alignment marks are selected in each of the exposure fields of one of the at least two alignment patterns, and each of the alignment marks of each of the exposure fields is selected by at least one of the at least two alignment patterns;
   receiving a semiconductor wafer of the semiconductor wafers;
   selecting one of the at least two alignment patterns according to a predetermined order; and
   performing the aligning operation upon the received semiconductor wafer by using the selected alignment pattern.

10. The semiconductor method of claim 9, wherein each of the at least two alignment patterns is different from any of the others.

11. The semiconductor method of claim 9, wherein for each of the alignment patterns, each of the at least two exposure fields has only one of the at least two alignment marks being selected.

12. The semiconductor method of claim 9, wherein each of the at least two alignment marks of each of the at least two exposure fields is selected by only one of the at least two alignment patterns.

13. The semiconductor method of claim 9, further comprising:
performing an exposure operation upon the semiconductor wafer after the aligning operation.

14. The semiconductor method of claim 13, further comprising:
obtaining overlay data for the semiconductor wafer after the exposure operation.

15. The semiconductor method of claim 9, wherein the at least two alignment marks of each of the at least two exposure fields locate at different locations of the at least two exposure fields.

16. The semiconductor method of claim 15, wherein the at least two exposure fields substantially have a same integrated circuit pattern.

17. The semiconductor method of claim 9, wherein each of the at least two exposure fields includes at least one die.

18. A semiconductor method performed upon a semiconductor wafer, wherein the semiconductor wafer includes a first exposure field and a second exposure field, and each of the first exposure field and the second exposure field includes a first alignment mark and a second alignment mark, the method comprising:
determining an alignment pattern by selecting the first alignment mark of the first exposure field and the second alignment mark of the second exposure field;
receiving the semiconductor wafer; and
performing the aligning operation upon the received semiconductor wafer by using the alignment pattern.

19. The semiconductor method of claim 18, wherein the first alignment mark and the second alignment mark are located at different locations of each of the first exposure field and the second exposure field.

20. The semiconductor method of claim 18, wherein the first exposure field and the second exposure field substantially have a same integrated circuit pattern.

* * * * *